United States Patent
Zimmermann et al.

(10) Patent No.: US 6,472,696 B1
(45) Date of Patent: Oct. 29, 2002

(54) MEMORY CELL CONFIGURATION AND CORRESPONDING PRODUCTION PROCESS

(75) Inventors: Ulrich Zimmermann, Mechanicsville, VA (US); Thomas Böhm, Zorneding (DE); Manfred Hain, Vaterstetten (DE); Armin Kohlhase, Neubiberg (DE); Yoichi Otani, Mapsudo (JP); Andreas Rusch; Alexander Trüby, both of Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/645,763

(22) Filed: Aug. 25, 2000

(Under 37 CFR 1.47)

Related U.S. Application Data

(63) Continuation of application No. PCT/DE99/00517, filed on Feb. 25, 1999.

(30) Foreign Application Priority Data

Feb. 25, 1998 (DE) .......................................... 198 07 920

(51) Int. Cl.⁷ ............................................... H01L 27/10
(52) U.S. Cl. ........................ 257/204; 257/208; 438/128; 438/129
(58) Field of Search ................................ 257/204, 208; 438/128, 129

(56) References Cited

U.S. PATENT DOCUMENTS 5,448,090 A * 9/1995 Geissler et al. ............. 257/305
5,920,778 A * 7/1999 Rosner et al. ............... 438/270
6,281,557 B1 * 8/2001 Trueby et al. ............... 257/390

FOREIGN PATENT DOCUMENTS

| DE | 42 14 923 A1 | 12/1992 |
| DE | 195 10 042 C2 | 9/1996 |
| DE | 195 14 834 C1 | 1/1997 |
| JP | 4-226 071 | 8/1992 |
| JP | 05 343 680 | 12/1993 |

* cited by examiner

Primary Examiner—Nathan J. Flynn
Assistant Examiner—Scott R. Wilson
(74) Attorney, Agent, or Firm—Laurence A. Greenberg; Werner H. Stemer; Ralph E. Locher

(57) ABSTRACT

The memory cell configuration has a large number of memory cells provided in a semiconductor substrate and having bit-line trenches which extend in parallel in the longitudinal direction in the main face of the semiconductor substrate, at the bottoms of which in each case a first conductive region is provided, at the peaks of which in each case a second conductive region of the same conduction type as the first conductive region is provided, and in the walls of which in each case an intermediately located channel region is 0 provided; and having word lines which extend in the transverse direction along the main face of the semiconductor substrate, through specific bit-line trenches, to activate transistors provided there. An additional dopant is introduced into the trench walls of the bit-line trenches which are located between the word lines, in order to increase the corresponding transistor turn-on voltage there to suppress leakage currents.

11 Claims, 2 Drawing Sheets ial Appli
MEMORY CELL CONFIGURATION AND CORRESPONDING PRODUCTION PROCESS

CROSS-REFERENCE TO RELATED APPLICATION

This is a continuation of copending International Application PCT/DE99/00517, filed Feb. 25, 1999, which designated the United States.

BACKGROUND OF THE INVENTION

1. Field of the Invention

The invention lies in the semiconductor technology field. More specifically, the present invention relates to a memory cell configuration having a large number of memory cells provided in a semiconductor substrate and having bit-line trenches which extend in parallel in the longitudinal direction in the main face of the semiconductor substrate. A first conductive region is provided at the bottoms of the bit-line trenches and a second conductive region of the same conductivity type as the first conductive region is provided at the peaks of each of the bit-line trenches. An intermediately located channel region is provided in the walls in each case. Word lines extend in the transverse direction along the main face of the semiconductor substrate through specific bit-line trenches to activate transistors provided there.

Although it can be used on memories made of any desired base material, the present invention and the problem on which it is based will be explained with reference to a memory based on silicon.

Early memory cell configurations were predominantly based on planar concepts. With the predefinition of a continuously increasing packing density, it was proposed, initially for mask ROM applications (read-only memories) and subsequently for memories with optional access (RAM memories) to fold the cell area of the memory by means of the introduction of parallel longitudinal trenches, and therefore to produce the projection of the cell area onto the wafer surface by up to 50%.

Commonly assigned U.S. Pat. No. 5,920,099 (German patent application DE 195 10 042) discloses a read-only memory cell configuration in which the memory cells are arranged in lines which extend in parallel. Longitudinal trenches are provided which extend essentially parallel to the lines. There, the lines are arranged in each case alternately on the main face between adjacent longitudinal trenches and on the bottom of the longitudinal trenches. Isolation structures are provided for the mutual isolation of the memory cells, which each comprises an MOS transistor. Extending transversely to the lines are word lines, which are each connected to the gates of MOS transistors arranged in different lines. In that case, the minimum theoretical space requirement for each memory cell is $2 \cdot F^2$, where F is the minimum structure size of the respective technology.

Commonly assigned U.S. Pat. No. 5,920,778 (German patent application DE 195 14 834) discloses a read-only memory cell configuration which has first memory cells with a vertical MOS transistor and second memory cells without a vertical MOS transistor. The memory cells are arranged along opposite flanks of strip-like isolation trenches which extend in parallel. If the width and spacing of the isolation trenches are selected to be equal in size, the minimum space requirement for each memory cell is theoretically $2\ F^2$, where F is the minimum structure size of the technology.

The problem on which the present invention is based is that, in such cell configurations having line regions which extend in parallel with the longitudinal trenches, alternately on the peaks of the trenches and the bottoms of the trenches, the word lines extending perpendicular thereto at a specific spacing from one another, the silicon on the trench walls between the word lines is not covered by gate electrodes. If charges are present in the isolation oxides, spacer oxides or other layers which are deposited in front of them in the further production process, it is possible for a channel to be formed there, which leads to unacceptable leakage currents between the conductive regions on the peaks of the trenches and the bottoms of the trenches.

Attempts have been made to solve this problem by providing a high basic doping level of the silicon in the cell field. However, this usually has disadvantageous effects on the vertical components. In addition, attempts have been made to minimize the charge density in the oxides, which makes the corresponding processes more expensive and cannot be reliably controlled from the start.

SUMMARY OF THE INVENTION

The object of the invention is to provide a memory cell configuration an a production method which overcomes the above-noted deficiencies and disadvantages of the prior art devices and methods of this kind, and which enables simple and reliable production and allows the leakage currents to be reduced considerably without a relatively large process outlay.

With the above and other objects in view there is provided, in accordance with the invention, a memory cell configuration, comprising:

a semiconductor substrate having a main face and defined longitudinal and transverse directions;

a multiplicity of memory cells formed in the semiconductor substrate;

a plurality of mutually parallel bit-line trenches extending in the longitudinal direction in the main face of the semiconductor substrate, the bit-line trenches having bottoms each formed with a first conductive region, peaks each formed with a second conductive region of a same conductivity type as the first conductive region is provided, and walls with a respective intermediately located channel region; and word lines extending in the transverse direction along the main face of the semiconductor substrate, through specific the bit-line trenches, for activating transistors formed in the specific bit-line trenches; and additional dopant introduced in the trench walls of the bit-line trenches located between the word lines, for increasing a corresponding transistor turn-on voltage to suppress leakage currents.

By comparison with the prior art memory cell configurations, the memory cell configuration according to the invention has the advantage that the leakage currents at the relevant trench walls can be reduced considerably without the process being significantly more complicated. In the production process according to the invention, the vertical components are essentially protected by the word lines that have already been applied, if it is ensured that the implantation direction lies in a plane which passes essentially perpendicularly through the center of the word lines. In other words, the implantation direction should be selected such that, in essential terms, no dopant can pass under the word lines into the vertical components, that is to say transistors, already produced. In addition, if appropriate, sensitive peripheral or planar components should be protected.

In general terms, the idea on which the present invention is based is that an additional dopant is introduced into the trench walls of the bit-line trenches which are located between the word lines, in order to increase the corresponding transistor turn-on voltage there to suppress leakage currents.

In accordance with a preferred embodiment of the invention, the memory cell configuration is a read-only memory with cells having a cell size of $2F^2$, where F is a minimum structure width.

In accordance with an added feature of the invention, the memory cells are each arranged on opposite walls of the bit-line trenches.

In accordance with an additional feature of the invention, the memory cells include first memory cells storing a first logic value and having at least one vertical transistor, and second memory cells storing a second logic value and not having a vertical transistor.

With the above and other objects in view there is also provided, in accordance with the invention, a method of producing a memory cell configuration, such as the assembly according to the above summary. The method comprises the following steps:

providing a semiconductor substrate;
forming a multiplicity of bit-line trenches in a main face of the semiconductor substrate;
forming first conductive regions on respective bottoms of the bit-line trenches and second conductive regions on peaks of the bit-line trenches;
forming transistors at specific locations in the respective bit-line trenches;
forming the word lines; and
introducing additional dopant into trench walls extending between the word lines, for increasing a corresponding transistor turn-on voltage at the additionally doped locations.

The additional dopant may be implanted, preferably by simultaneous implantation. Additionally, the first and second conductive regions may be formed by simultaneous diffusion.

In accordance with another feature of the invention, two implantations are carried out, with implantation angles inclined in mutually opposite directions with respect to a vertical to the main face of the semiconductor substrate.

In accordance with a further preferred development of the invention, the implantation is carried out in a self-adjusting manner in relation to the word lines that are already present. This has the advantage that masking the word lines can be dispensed with, and therefore the additional outlay is very small.

In accordance with a concomitant feature of the invention, the implantation is carried out in a dedicated photoplane. This dedicated photoplane should protect at least peripheral and/or planar components on which the additional implantations could have detrimental effects.

Other features which are considered as characteristic for the invention are set forth in the appended claims.

Although the invention is illustrated and described herein as embodied in a memory cell configuration and corresponding production process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Identical reference symbols designate identical or functionally equivalent components throughout the figures.

DESCRIPTION OF THE PREFERRED EMBODIMENTS

Figure 1:
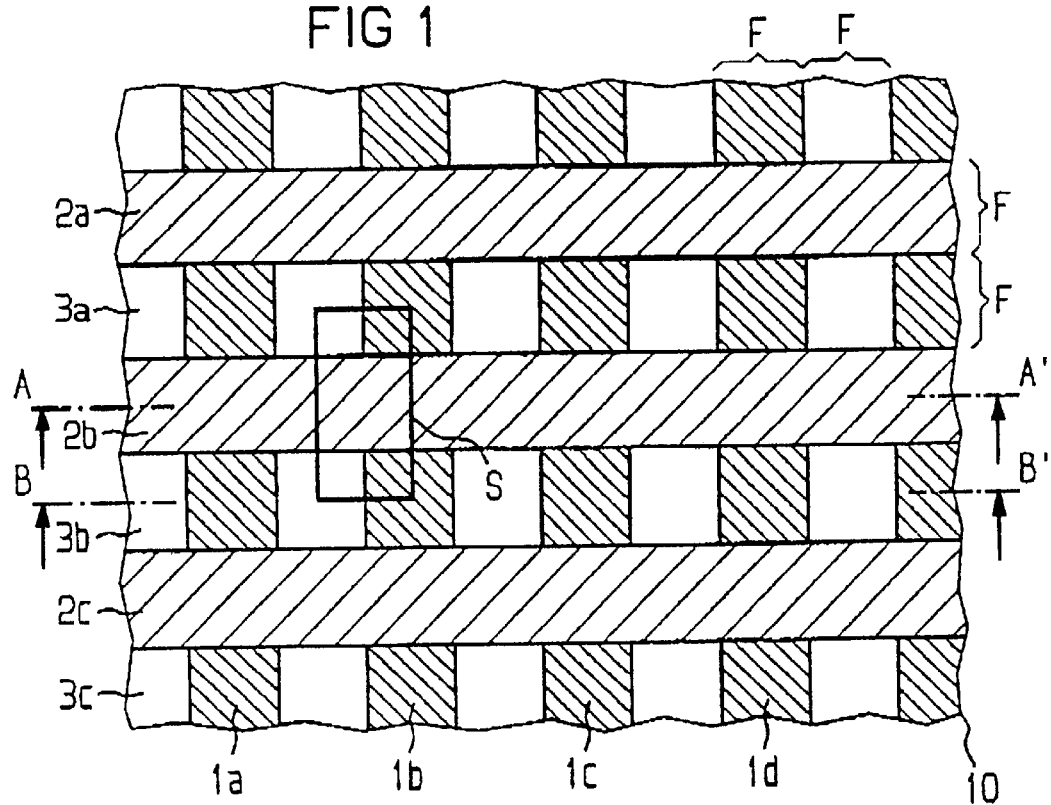
FIG. 1 is a plan view of a cell field in one embodiment of the memory cell configuration according to the invention.

Referring now to the figures of the drawing in detail and first, particularly, to FIG. 1 thereof, there is seen a plan view of a cell field according to one embodiment of the novel memory cell configuration.

The cell field has bit-line trenches $1a$, $1b$, $1c$, $1d$; word lines $2a$, $2b$, $2c$; and exposed strips $3a$, $3b$, $3c$ between the word lines $2a$ to $2c$. The semiconductor substrate is designated with the reference numeral 10, S designates a memory cell and F designates the minimum structure width.

The cell field of FIG. 1 has a large number of memory cells directly adjoining one another and provided in the semiconductor substrate 10, only the memory cell S being designated for reasons of clarity. The bit-line trenches $1a$–$1d$ extend parallel to one another in the longitudinal direction in the main face of the semiconductor substrate 10, in each case a lower bit line ($15a$–$15d$ in FIGS. 2 and 3) being provided in the bottoms of the bit-line trenches. In the peaks (i.e., crowns) of the bit-line trenches $1a$–$1d$, in each case an upper bit line ($20a$–$20d$ in FIGS. 2 and 3) is provided, and in the walls of the bit-line trenches $1a$–$1d$ in each case a channel region is provided, namely the respective region lying between the lower bit lines and the upper bit lines. The word lines $2a$–$2c$, which are isolated at least at the bottom, extend in the transverse direction A–A' along the main face of the semiconductor substrate 10, through certain bitline trenches $1a$–$1d$. The word lines are provided to activate the corresponding transistors of the memory cells, whose structure will be explained in more detail in connection with FIG. 2.

In the following text, the dimensional ratios in the cell field according to this embodiment of the memory cell configuration according to the invention will be explained in more detail. The bottoms of the bit-line trenches $1a$–$1d$, the peaks of the bit-line trenches $1a$–$1d$ and the word lines $2a$–$2c$, as well as the strips $3a$–$3c$ between the word lines, each have a minimum structure width F. Each memory cell S therefore occupies an area of $2 \cdot F^2$.

Figure 2:
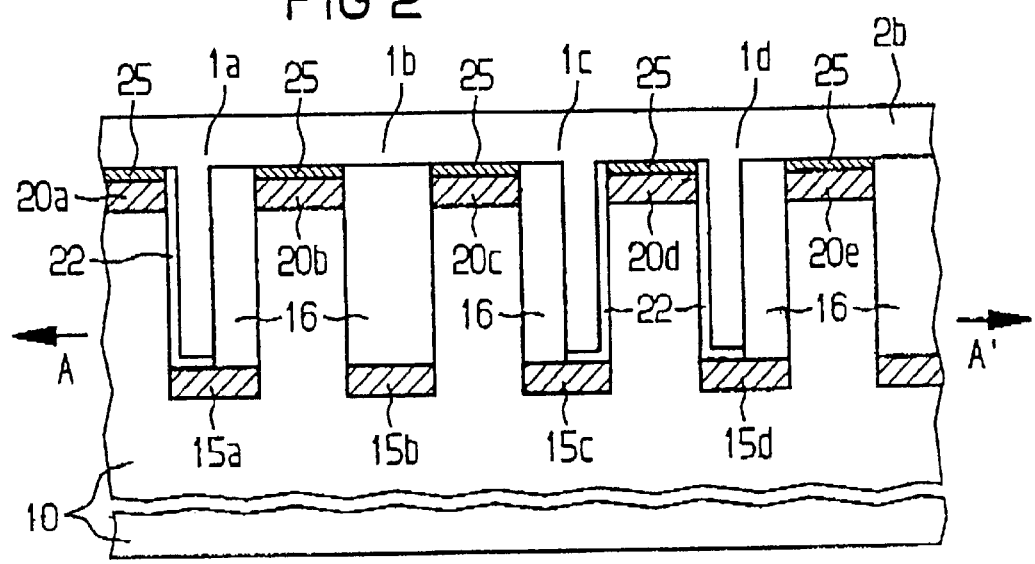
FIG. 2 is a vertical section through the cell field along the line A–A' in FIG. 1.

FIG. 2 represents the vertical section along the line A–A' in FIG. 1. Here, the semiconductor substrate is designated with the numeral 10, $15a$–$15d$ designate the lower bit lines, $20a$–$20e$ designate the upper bit lines, 25 designates an upper insulation of the upper bit lines $20a$–$20e$ with respect to the word lines $2a$–$2c$. A gate oxide is identified with 22 and 16 designates an insulating trench filler material.

The memory cells are in each case arranged on opposite walls of the bit-line trenches $1a$–$1d$. In this case, the memory cells comprise first memory cells (for example in the bit-line trenches $1a$, $1c$, $1d$) in which a first logic value is stored and which have at least one vertical transistor. The vertical transistor is implemented by the word line extending into the trench, over the corresponding channel region, as a gate contact. Here, the gate oxide layer 22 is provided between the respective gate contacts and the channel regions. In addition, the memory cells comprise second memory cells (for example in the bit-line trench 1b) in which a second logic value is stored and which do not have a vertical transistor.

Figure 3:
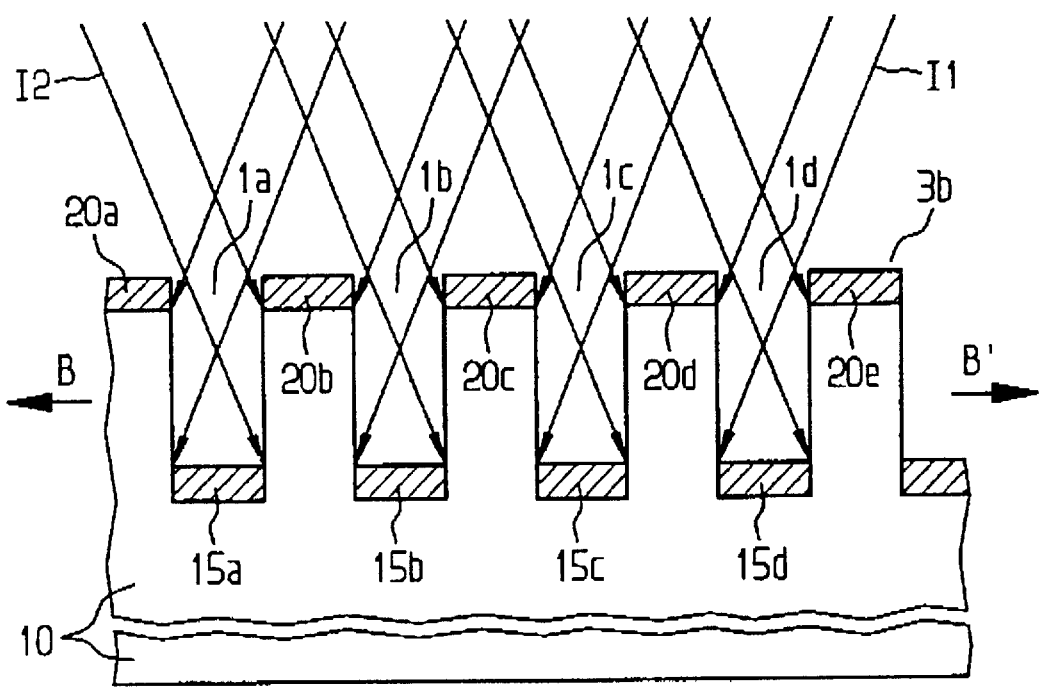
FIG. 3 is a vertical section through the cell field along the line B–B' in FIG. 1.

FIG. 3 represents the vertical section along the line B–B' in FIG. 1. The strips between the word lines 2a–2c have a silicon region that is not covered by gates and which is threatened with regard to undesired leakage currents between the peaks and the bottoms of the trenches, specifically, for example, by charges in an oxide to be deposited on them later.

This is where the present invention comes in. Expediently, following the gate-stack structuring, a dopant corresponding to the well-doping in the cell field, for example boron in the case of a p-well, is additionally introduced into the trench walls over the entire area of the bit-line trenches 1a–1d which lie between the word lines 2a–2c, in order to increase the corresponding transistor turn-on voltage of these exposed silicon regions there to suppress leakage currents.

This is done by means of implantation I1, I2 of the additional dopant into the trench walls which extend between the word lines. The implantation direction is in a plane that is perpendicular to the word lines and inclined as far as possible with respect to the vertical, in order to achieve a high projection of the area dopant level onto the vertical trench walls without excessive shadowing by the edges of the webs. In particular, in order to introduce the additional dopant, two implantations I1, I2 are carried out, which are inclined in opposite directions with respect to the vertical to the main face of the semiconductor substrate 10, so that both trench walls are reached.

The implantation is carried out in a self-aligning manner in relation to the word lines 2a–2c. In order to prevent the dopant running out into the adjacent channels, this step should be carried out following the annealing of the gate stack.

It will be understood by those of skill in this art that, although the present invention has been described above using preferred exemplary embodiments, it is not restricted to these embodiments but can be modified in many and various ways.

For example, while the exemplary embodiment has been described in the context of a read-only memory, the present invention can also be used on other corresponding memories having bitline trenches.

In particular, the base materials and additional materials specified are only-exemplary and can be replaced by other suitable materials.

In addition, the implantation can be carried out in a dedicated photoplane, in which at least planar and/or peripheral components are protected from the implantations.

Finally, the introduction of the additional dopant can in principle also be carried out in a furnace process.

We claim:

1. A memory cell configuration, comprising:
    a semiconductor substrate having a main face and defined longitudinal and transverse directions;
    a multiplicity of memory cells formed in said semiconductor substrate;
    a plurality of mutually parallel bit-line trenches extending in the longitudinal direction in said main face of said semiconductor substrate, said bit-line trenches having bottoms each formed with a first conductive region, peaks each formed with a second conductive region of a same conductivity type as the first conductive region is provided, and walls with a respective intermediately located channel region; and
    word lines extending in the transverse direction along said main face of said semiconductor substrate, through specific said bit-line trenches, for activating transistors formed in said specific bit-line trenches; and
    additional dopant introduced in said trench walls of said bit-line trenches located between said word lines, for increasing a corresponding transistor turn-on voltage to suppress leakage currents.

2. The memory cell configuration according to claim 1, wherein said memory cells are read-only memory cells with a cell size of $2 \cdot F^2$, F being a minimum structure width.

3. The memory cell configuration according to claim 2, wherein said memory cells are each arranged on opposite walls of said bit-line trenches.

4. The memory cell configuration according to claim 2, wherein said memory cells include first memory cells storing a first logic value and having at least one vertical transistor, and second memory cells storing a second logic value and not having a vertical transistor.

5. A method of producing a memory cell configuration, which comprises the following steps:
    providing a semiconductor substrate;
    forming a multiplicity of bit-line trenches in a main face of the semiconductor substrate;
    forming first conductive regions on respective bottoms of the bit-line trenches and second conductive regions on peaks of the bit-line trenches;
    forming transistors at specific locations in the respective bit-line trenches;
    forming the word lines; and
    introducing additional dopant into trench walls extending between the word lines, for increasing a corresponding transistor turn-on voltage at the additionally doped locations.

6. The method according to claim 5, wherein introducing step comprises implanting the additional dopant.

7. The method according to claim 5, wherein the steps of forming the first and second conductive regions are performed by simultaneous implantation.

8. The method according to claim 5, wherein the steps of forming the first and second conductive regions are performed by simultaneous diffusion.

9. The process according to claim 5, wherein the introducing step comprises carrying out two implantations, with implantation angles inclined in mutually opposite directions with respect to a vertical to the main face of the semiconductor substrate.

10. The process according to claim 5, wherein the implanting step comprises implanting in a self-aligning manner in relation to the word lines.

11. The process according to claim 5, wherein the implanting step comprises carrying out an implantation in a dedicated photoplane.

* * * * *